United States Patent [19]

Okamoto

[11] Patent Number: 5,214,509
[45] Date of Patent: May 25, 1993

[54] DISPLAY DEVICE TESTING CIRCUIT USING FALSE VIDEO SIGNAL GENERATOR

[75] Inventor: Nobuyuki Okamoto, Tokyo, Japan
[73] Assignee: Sony Corporation, Tokyo, Japan
[21] Appl. No.: 821,042
[22] Filed: Jan. 16, 1992

[30] Foreign Application Priority Data

Jan. 22, 1991 [JP] Japan .................................. 3-22806

[51] Int. Cl.$^5$ ........................ H04N 3/24; H04N 17/00
[52] U.S. Cl. .................................... 358/165; 358/33;
358/34; 358/171; 358/10; 358/139
[58] Field of Search ................ 358/139, 10, 171, 165,
358/170, 174, 34, 172, 33

[56] References Cited

U.S. PATENT DOCUMENTS

| | | | |
|---|---|---|---|
| 3,959,811 | 5/1976 | Shanley, II | 358/34 X |
| 4,204,221 | 5/1980 | Shanley, II | 358/34 |
| 4,328,514 | 5/1982 | Nakashima et al. | 358/170 X |
| 4,506,292 | 3/1985 | Newton et al. | 358/34 |
| 4,689,679 | 8/1987 | Hinn | 358/34 X |
| 4,716,461 | 12/1987 | Hinn | 358/165 |
| 4,811,101 | 3/1989 | Yagi | 358/172 X |

Primary Examiner—Victor R. Kostak
Attorney, Agent, or Firm—Lewis H. Eslinger; Jay H. Maioli

[57] ABSTRACT

A display device testing circuit includes a false video signal generator for producing a false video signal from a blanking pulse of the display device in a state where no video signal is connected to an input terminal of the display device, so that such false video signal is supplied to the video amplifier. A false clamp pulse generating circuit produces a false clamp pulse from the blanking pulse and supplies the false clamp pulse to a pedestal clamper in the video amplifier, thereby realizing a simplified test of the video amplifier at low cost.

2 Claims, 2 Drawing Sheets

FIG.2A VIDEO SIGNAL / PEDESTAL

FIG.2B BLANKING PULSE

FIG.2C CLAMP PULSE (PRODUCED FROM VIDEO SIGNAL)

FIG.2D FALSE CLAMP PULSE

FIG.2E FALSE MAXIMUM-WHITE SIGNAL / PULSE F CLAMPS THIS PORTION TO PEDESTAL LEVEL (ERROR) / PULSE CLAMPS THIS PORTION TO PEDESTAL LEVEL (CORRECT)

FIG.2F CLAMP PULSE (PRODUCED FROM FALSE MAXIMUM-WHITE SIGNAL)

DISPLAY DEVICE TESTING CIRCUIT USING FALSE VIDEO SIGNAL GENERATOR

BACKGROUND OF THE INVENTION

1. Field of the Invention

The present invention relates to a circuit for testing a display device to detect any fault therein.

2. Description of the Prior Art

It has been known heretofore that, for the purpose of detecting the presence or absence of any fault in a CRT display device when no video signal is supplied from a computer, a test is conducted to brighten the CRT by either lowering a cathode voltage to the CRT or raising a first grid voltage therein.

The above prior art technique is effective for checking if a deflector and a power supply in the display device are normal or not. However, it is not exactly effective for testing a video amplifier which is incorporated to amplify a video signal. Although there is available an improved display device of a type including a signal generator to test a video amplifier, a problem of high production cost is unavoidable.

OBJECTS AND SUMMARY OF THE INVENTION

It is an object of the present invention to provide a display device testing circuit which is capable of testing a video amplifier in a display device at low cost.

And another object of the present invention resides in providing a display device testing circuit of a simplified constitution capable of detecting any fault in both a video amplifier and a pedestal clamper incorporated in the display device for clamping a video signal to a pedestal level by a clamp pulse produced from the video signal.

In the circuit of one disclosed embodiment for testing a display device equipped with a video amplifier to amplify a video signal, a false video signal generator is included for producing a false video signal from a blanking pulse of the display device in a state where none of signal cables is connected to an input terminal, and supplying such false video signal to the video amplifier.

And in the circuit of another disclosed embodiment for testing a display device equipped with a video amplifier which serves to amplify a video signal and includes a clamper for producing a clamp pulse from the video signal and clamping the video signal to a predetermined level by the clamp pulse thus produced, there are incorporated a false video signal generator for producing a false video signal from a blanking pulse of the display device in a state where none of signal cables is connected to an input terminal, and supplying such false video signal to the video amplifier; and a false clamp pulse generating circuit for producing a false clamp pulse from the blanking pulse and supplying such false clamp pulse to the clamper.

According to the display device testing circuit defined in the first disclosed embodiment, a false video signal produced from a blanking pulse is supplied to the video amplifier, which can thereby be tested without the necessity of providing any additional signal generator.

And according to the display device testing circuit defined in the second disclosed embodiment, a false video signal produced from a blanking pulse is supplied to the video amplifier while a false clamp pulse produced from the blanking pulse is supplied to the pedestal clamper, so that there never occurs a state where the original level (e.g., white level) of the false video signal is clamped to a different level (e.g., black level), hence achieving a simplified correct test of the video amplifier equipped with the pedestal clamper.

The above and other features and advantages of the present invention will become apparent from the following description which will be given with reference to the illustrative accompanying drawings.

BRIEF DESCRIPTION OF THE DRAWINGS

FIGS. 2A–2F are waveforms timing chart of signals obtained in principal portions of the display device testing circuit shown in FIG. 1.

DESCRIPTION OF THE PREFERRED EMBODIMENT

Figure 1:
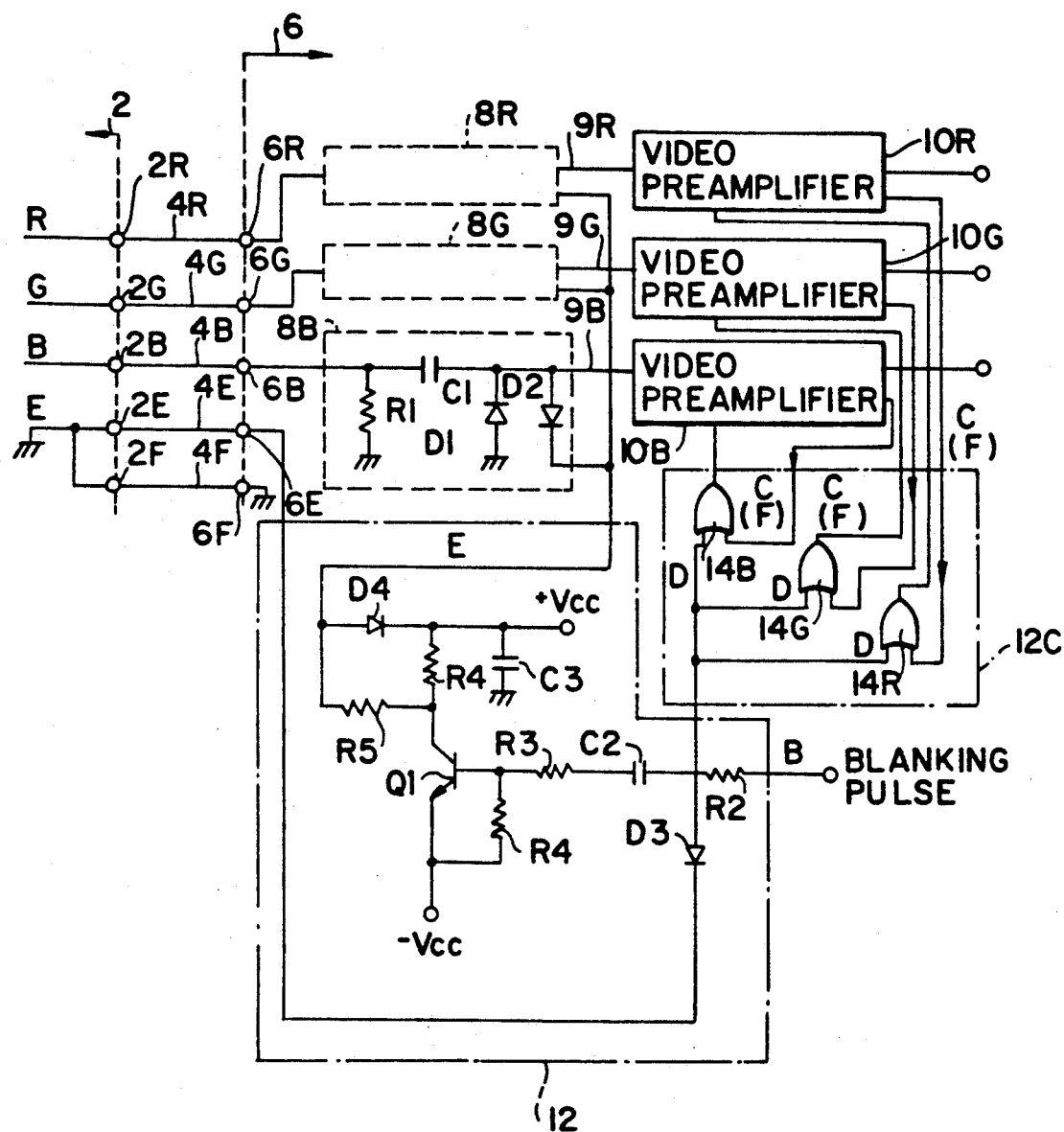
FIG. 1 is a circuit diagram of an exemplary embodiment representing the display device testing circuit of the present invention.

FIG. 1 is a circuit diagram of an exemplary embodiment which represents the display device testing circuit of the present invention. A red signal input terminal 6R, a green signal input terminal 6G, a blue signal input terminal 6B and ground terminals 6E, 6F of a display device 6 are connected via cables 4R, 4G, 4B and 4E, 4F respectively to output terminals 2R, 2G, 2B and ground terminals 2E, 2F for a red signal (R), a green signal (G) and a blue signal (B) of a primary color video image supplied from a computer 2 which serves as a signal source. The red, green and blue input terminals 6R, 6G and 6B are connected respectively to input circuits 8R, 8G and 8B. The three input circuits 8R, 8G and 8B are mutually the same in structure, and each has an input resistor R1 connected between the input terminal (6B, 6G or 6B) and the ground point, a capacitor C1 connected between the input terminal and an output line (9R, 9G or 9B), a static protection diode D1 whose cathode is connected to the output line and whose anode is connected to the ground point, and a static protection diode D2 whose anode is connected to the output line and whose cathode is connected to an output line 12S of an undermentioned false video signal generator 12.

The static protection diode D1 is turned on when a negative pulse voltage lower than the ground potential is supplied to the input terminal (6R, 6G or 6B), and serves to prevent generation of any voltage lower than the ground potential at the output line (9R, 9G or 9B). Meanwhile the static protection diode D2 is turned on when a positive pulse voltage higher than a predetermined voltage (in this embodiment, a bias voltage +Vcc of an undermentioned false video signal generator 12) is supplied to the input terminal (6R 6G or 6B), and serves to prevent generation of any voltage higher than the predetermined voltage at the output line (9R, 9G or 9B).

The output lines 9R, 9G and 9B of the input circuits 8R, 8G and 8B are connected respectively to input terminals of video preamplifiers 10R, 10G and 10B. The video preamplifiers 10R, 10G and 10B are mutually the same in structure with a function of amplifying a video signal, and each includes a pedestal clamper for clamping a back porch of the video signal to a pedestal level by a clamp pulse C produced from the video signal.

The clamp pulses C produced from the video preamplifiers 10R, 10G and 10B by delaying a sync signal obtained from a sync separator are supplied via OR gates 14R, 14G and 14B respectively to the pedestal clampers in the video preamplifiers 10R, 10G and 10B.

The false video signal generator 12 produces a false video signal, which is a false maximum-white signal E, out of the blanking pulse B received from a deflector and then supplies such false video signal via the output line 12S to cathodes of the static protection diodes D2 in the input circuits 8R, 8G and 8B. Furthermore the false video signal generator 12 includes a false clamp pulse generating circuit 12C which produces a false clamp pulse D out of the blanking pulse B obtained from the deflector and supplies such false clamp pulse D via OR gates 14R, 14G and 14B to the pedestal clampers in the video preamplifiers 10R, 10G and 10B.

More specifically, the false video signal generator 12 comprises a series input resistor R2 to receive the blanking pulse B, a capacitor C2 and a resistor R3 connected in series to the resistor R2, an inverter transistor Q1 whose base is connected to the resistor R3, a resistor R4 connected between the base and the emitter of the transistor Q1, a negative voltage source −Vcc for biasing the emitter of the transistor Q1, a resistor R4 connected between the collector of the transistor Q1 and the positive bias voltage source +Vcc, a capacitor C3 connected between the positive bias voltage source +Vcc and the ground point, a capacitor C3 connected between the positive bias voltage source +Vcc and the ground point, a resistor R5 connected between the collector of the transistor Q1 and the output line 12S, a diode D4 whose cathode is connected to the positive bias voltage source +Vcc and whose anode is connected to the output line 12S, and a diode D3 whose anode is connected to the junction of the resistor R2 and the capacitor C2 and whose cathode is connected to the ground terminal 6E. The false clamp pulse generating circuit 12C consists of a signal line which connects the junction of the resistor R2 and the capacitor C2 to the inputs of the OR gates 14R, 14G and 14B.

FIG. 2 shows exemplary waveforms of signals obtained in principal portions of the embodiment representing the display device testing circuit of the present invention shown in FIG. 1. The operation of the testing circuit in FIG. 1 will now be described below with reference to FIG. 2. In a normal operating state, the output terminals 2R, 2G, 2B and the ground terminal 2E of the computer 2 are connected via the cables 4R, 4G, 4B respectively to the input terminals 6R, 6G and 6B of the display device 6. When the blanking pulse B is supplied in this state to the false video signal generator 12, the diode D3 is turned on so that the potential at the junction of the resistor R2 and the capacitor C2 is held to be constant (at the ground potential), whereby the false maximum-white signal E is not generated in the output line 12S, and the false clamp pulse D is not generated either from the false clamp pulse generating circuit 12C.

The pedestal clampers in the video preamplifiers 10R, 10G and 10B produce clamp pulses C in synchronism with the trailing edges of sync pulses of the video signal A supplied from the input circuits 8R, 8G and 8B respectively, and the video signal is clamped to the pedestal level in response to the pulses C received via the OR gates 14R, 14G and 14B respectively.

If the blanking pulse B is supplied to the false video signal generator 12 when the input terminals 6R 6G, 6B and the ground terminal 6E of the display device 6 are not connected respectively to the output terminals 2R, 2G, 2B and the ground terminal 2E of the computer 2, then the diode D3 is maintained in its off-state since the ground terminal 6E is not connected to the ground terminal 2E, whereby the blanking pulse B is inverted and amplified by the inverter transistor Q1 and a false maximum-white signal E is generated in the output line 12S. The false clamp pulse generating circuit 12C regards the input blanking pulse B as a false clamp pulse D and supplies the same via the OR gates 14R, 14G and 14B respectively to the pedestal clampers in the video preamplifiers 10R, 10G and 10B.

The pedestal clampers in the video preamplifiers 10R, 10G and 10B clamp the black level of the false maximum-white signal E to the pedestal level (black level) by using the false clamp pulse D. Consequently the white level of the false maximum-white signal E can be maintained directly as the white level.

If a clamp pulse F is generated in synchronism with the leading edge of the false maximum-white signal E by the pedestal clampers in the video preamplifiers 10R, 10G and 10B without the provision of the false clamp pulse generating circuit 12C, the white level of the false maximum-white signal is clamped to the pedestal level (black level) since the timing of generation of the clamp pulse F corresponds to the white level of the false maximum-white signal E, so that the false maximum-white signal E fails to be maximum white. It becomes therefore necessary to provide the circuit 12C which is capable of generating the false clamp pulse 2D synchronously with the false maximum-white signal E.

In the embodiment mentioned, an inverter transistor is employed to generate a false maximum-white signal. However, it is obvious that any other suitable electronic element may be used as well.

Although in the embodiment a false maximum-white signal is generated to serve as a false video signal, it is also possible to generate a false red signal, green signal or the like for the same purpose. However, the use of a false maximum-white signal is the most preferable since it is adapted for testing all of the red, green and blue video preamplifiers simultaneously.

According to the display device testing circuit defined in the appended claim 1, a false video signal is produced from a blanking pulse and then is supplied to a video amplifier, so that the video amplifier can be tested by a minimum number of additional component elements.

And according to the display device testing circuit defined in the appended claim 2, a false clamp pulse is produced from a blanking pulse and then is supplied to a pedestal clamper, so that the black level, for example, of a false video signal can be clamped properly to the pedestal black level, hence realizing a simplified correct test of the video amplifier equipped with the pedestal clamper.

What is claimed is:

1. A circuit for testing a display device having video signal input terminals connected thereto and being equipped with a video amplifier to amplify an input video signal, said circuit comprising:

a terminal for receiving a blanking pulse of said display device;

a ground connection;

a diode connected to said blanking pulse terminal;

removable cable means selectively connecting said blanking pulse terminal through said diode to said ground connection in a normal operating state;

a false video signal generator which is connected to said blanking pulse terminal and selectively disconnected from said ground connection in a testing state for producing a false video signal from a blanking pulse of said display device in a state where no video signal is supplied to the input terminals and which is connected to said ground connection through said diode and said cable means in a normal operating state when a video signal is supplied to the input terminals so that said blanking pulse is grounded and fails to produce a false video signal; and means for supplying said false video signal whenever produced to the video amplifier of the display device.

2. A circuit for testing a display device having video signal input terminals connected thereto and a video amplifier to amplify the input video signal, said video amplifier including a clamper for producing a clamp pulse from said video signal and clamping said video signal to a predetermined level by said clamp pulse, said testing circuit comprising:

a terminal for receiving a blanking pulse of said display device;

a ground connection;

a diode connected to said blanking pulse terminal;

removable cable means selectively connecting said blanking pulse terminal through said diode to said ground connection in a normal operating state;

a false video signal generator which is connected to said blanking pulse terminal and selectively disconnected from said ground connection in a testing state for producing a false video signal from a blanking pulse of said display device in a state where no video signal is supplied to the input terminals and which is supplied to said ground connection through said diode and said cable means in a normal operating state when a video signal is supplied to the input terminals so that said blanking pulse is grounded and fails to produce a false video signal;

means for supplying said false video signal whenever produced to said video amplifier; and a false clamp pulse generating circuit for producing a false clamp pulse from said blanking pulse and supplying the false clamp signal to said clamper.

* * * * *